(12) United States Patent
Ni et al.

(10) Patent No.: US 11,223,334 B2
(45) Date of Patent: Jan. 11, 2022

(54) TRANSIMPEDANCE CIRCUITS AND METHODS

(71) Applicant: Analog Devices International Unlimited Company, Limerick (IE)

(72) Inventors: Jinhua Ni, Shanghai (CN); Wei Wang, Shanghai (CN); Hui Shen, Shanghai (CN)

(73) Assignee: ANALOG DEVICES INTERNATIONAL UNLIMITED COMPANY, Limerick (IE)

( * ) Notice: Subject to any disclaimer, the term of this patent is extended or adjusted under 35 U.S.C. 154(b) by 2 days.

(21) Appl. No.: 16/822,546

(22) Filed: Mar. 18, 2020

(65) Prior Publication Data

US 2021/0249999 A1    Aug. 12, 2021

(30) Foreign Application Priority Data

Feb. 7, 2020 (WO) ................ PCT/CN2020/074466

(51) Int. Cl.
*H03F 3/08* (2006.01)
*H03F 1/08* (2006.01)
*H03F 3/45* (2006.01)

(52) U.S. Cl.
CPC ............... *H03F 3/087* (2013.01); *H03F 1/08* (2013.01)

(58) Field of Classification Search
CPC ............... H03F 3/087; H03F 1/08; H03F 3/45

USPC .......................................... 330/308, 252–261
See application file for complete search history.

(56) References Cited

U.S. PATENT DOCUMENTS

| 6,323,734 | B1 | 11/2001 | Henrion et al. |
| 7,734,193 | B2* | 6/2010 | Day ........................ H04B 10/66 |
| | | | 398/202 |
| 9,064,981 | B2 | 6/2015 | Laforce |
| 10,145,736 | B2* | 12/2018 | Ahmed ................. H01L 31/107 |

OTHER PUBLICATIONS

Presicce et al., *A single-ended-to-differential transimpedance amplifier for a voice transceiver analog interface*, 1-4244-0157-7/06 © 2006 IEEE, 4 pages.
ADPD1080/ADPD1081, *Photometric Front Ends*, Analog Devices Data Sheet, 74 pages.

* cited by examiner

*Primary Examiner* — Hieu P Nguyen
(74) *Attorney, Agent, or Firm* — Patent Capital Group

(57) ABSTRACT

Disclosed herein are transimpedance circuits, as well as related methods and devices. In some embodiments, a transimpedance circuit may include a current source bias terminal, a current source output terminal, and a transimpedance amplifier coupled to the current source output terminal, wherein voltage signals at the current source bias terminal are correlated with voltage signals at the current source output terminal. In some embodiments, the current source may be a photodiode.

20 Claims, 2 Drawing Sheets

TRANSIMPEDANCE CIRCUITS AND METHODS

PRIORITY DATA

This application claims the benefit of and priority from PCT Application No. PCT/CN2020/074466 filed Feb. 7, 2020, entitled "TRANSIMPEDANCE CIRCUITS AND METHODS", incorporated herein by reference in its entirety.

BACKGROUND

Transimpedance circuits may receive a current as an input, and may generate a voltage as an output. Thus, a transimpedance circuit may be considered a current-controlled voltage source.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

DETAILED DESCRIPTION

Disclosed herein are transimpedance circuits, as well as related methods and devices. In some embodiments, a transimpedance circuit may include a current source bias terminal, a current source output terminal, and a transimpedance amplifier coupled to the current source output terminal, wherein voltage signals at the current source bias terminal are correlated with voltage signals at the current source output terminal. In some embodiments, the current source may be a photodiode. The transimpedance circuits and related embodiments disclosed herein may exhibit reduced noise and an improved signal-to-noise ratio (SNR) in the differential output voltage, relative to conventional approaches. For example, when utilized with a photodiode input, the transimpedance circuits disclosed herein may exhibit a noise reduction on the order of 10-20 decibels or more.

In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made, without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments. For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). For the purposes of the present disclosure, the phrase "A or B" means (A), (B), or (A and B).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. When used to describe a range of dimensions, the phrase "between X and Y" represents a range that includes X and Y.

Figure 1:
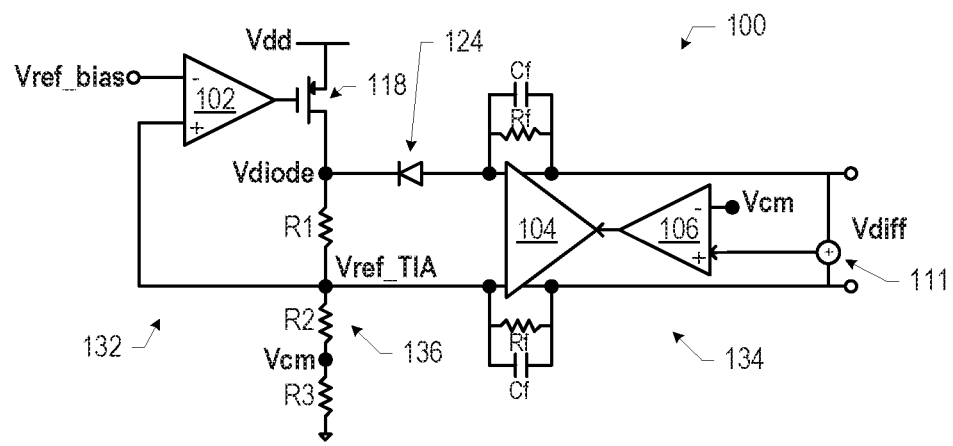
FIGS. 1 and 2 are schematics of example transimpedance circuits, in accordance with various embodiments.

FIG. 1 is a schematic of an example transimpedance circuit 100, in accordance with various embodiments. The transimpedance circuit 100 of FIG. 1 may include a bias voltage generator 132 coupled to a current source (a photodiode 124 in FIG. 1, but any suitable current source may be used) and to a transimpedance amplifier 134. The bias voltage generator 132 may include an amplifier 102 which may receive, at a first input (e.g., the "negative" input), a reference bias voltage Vref_bias. In some embodiments, the reference bias voltage Vref_bias may be a reference voltage provided by other circuitry (not shown). The bias voltage generator 132 may further include a transistor 118 (e.g., a P-type metal oxide semiconductor (PMOS) transistor) and a voltage divider 136. The gate of the transistor 118 may be coupled to the output of the amplifier 102, and the sources/drains of the transistor 118 may be coupled between a supply voltage Vdd and the voltage divider 136. The voltage divider 136 may include a first resistor R1, a second resistor R2, and a third resistor R3 arranged between the transistor 118 and ground; although the voltage divider 136 in the accompanying drawings includes three resistors, the voltage divider 136 may include more than three resistors, as desired. Further, a second input of the amplifier 102 (e.g., the "positive" input) may be coupled to the node between the second resistor R2 and the third resistor R3, providing a feedback path around the amplifier 102. More generally, the second input of the amplifier 102 may be coupled to any suitable node in the voltage divider 136. For example, if the voltage divider 136 includes more than three resistors, the second input of the amplifier 102 could be coupled to a node (which may be referred to as a "feedback node") between any suitable pair of resistors in the voltage divider 136 in order to provide a feedback path. If the reference bias voltage Vref_bias is greater than the transimpedance amplifier reference voltage Vref_TIA (discussed further below), then the feedback node may be a node "above" the transimpedance amplifier reference voltage Vref_TIA in the voltage divider 136. If the reference bias voltage Vref_bias is less than the transimpedance amplifier reference voltage Vref_TIA, then the feedback node may be a node "below" the transimpedance amplifier reference voltage Vref_TIA in the voltage divider 136.

The transimpedance amplifier 134 may be a single-input, differential output transimpedance amplifier 134. In particular, the transimpedance amplifier 134 may receive a current from the photodiode 124 (or other current source) as an input, and may output a differential output voltage Vdiff. The transimpedance amplifier may include a first amplifier 104 and a second amplifier 106 having coupled outputs, as shown. The inputs of the first amplifier 104 may be coupled to the photodiode 124 (or other current source) and to a node of the voltage divider 136 between the first resistor R1 and the second resistor R2 (labeled "Vref_TIA" and discussed further below). The inputs of the first amplifier 104 may be coupled to the output terminals of the first amplifier 104 via circuits including a capacitor Cf and a resistor Rf in parallel. A first input of the second amplifier 106 (e.g., the "negative" input) may be coupled to a node of the voltage divider 136 between the second resistor R2 and the third resistor R3 (labeled "Vcm" and discussed further below), and the second input of the second amplifier 106 (e.g., the "positive" input) may be coupled to a common-mode voltage circuit 111. The common-mode voltage circuit 111 may include circuitry to generate the common-mode voltage of the two outputs of the first amplifier 104, which may be represented by $$Vfb\_cm = (Voutp - Voutn)/2,$$

where Vfb_cm is the output of the common-mode voltage circuit 111 (and provided to the "positive" input of the second amplifier 106, Voutp is the "positive" output of the first amplifier 104, and Voutn is the "negative" output of the first amplifier 104. In some embodiments, the common-mode voltage circuit 111 may include a resistor Rfb1 coupled between Voutp and Vfb_cm, and a resistor Rfb2 (having a same resistance as the resistor Rfb1) coupled between Voutn and Vfb_cm. The differential output voltage Vdiff may be equal to Voutp−Voutn.

A diode bias voltage Vdiode may be taken between the transistor 118 and the first resistor R1 of the voltage divider 136, as shown, and may be coupled to the current source to provide a bias voltage to the current source (e.g., to provide a bias voltage to the cathode of the photodiode 124). A transimpedance amplifier reference voltage Vref_TIA may be taken between the first resistor R1 and the second resistor R2 of the voltage divider 136, and may be coupled to the first amplifier 104 of the transimpedance amplifier 134, as shown, to provide a reference voltage for the transimpedance amplifier 134. A common-mode voltage Vcm may be taken between the second resistor R2 and the third resistor R3 of the voltage divider 136, and may be coupled to the first input of the second amplifier 106 of the transimpedance amplifier 134, as noted above.

At low frequencies, the differential output voltage Vdiff may be approximately represented as $$2*(Vref\_TIA - Vcm),$$

while at high frequencies, the differential output voltage Vdiff may be approximately represented as $$Gain*(Vdiode - Vref\_TIA),$$

where Gain may be approximately represented as $$(Cpd/Cf)*(2*s*Rf*Cf)/((1+s*Rf*Cf)*(1+s*Rin*Cpd)),$$

with s representing the complex frequency component jw, Cpd representing the capacitance of the photodiode 124, and Rin representing the input impedance in series with the photodiode 124.

The voltage divider relationship between the diode bias voltage Vdiode, the transimpedance amplifier reference voltage Vref_TIA, and the common-mode voltage Vcm may result in a correlation between these voltages. In particular, noise in the bias voltage generator 132 (including noise from the reference bias voltage Vref_bias and noise arising from the amplifier 102) may appear in a correlated fashion in the diode bias voltage Vdiode, the transimpedance amplifier reference voltage Vref_TIA, and the common-mode voltage Vcm. Consequently, because the differential output voltage Vdiff is a function of differences between these voltages at low and high frequencies, as discussed above, the correlated noise appearing in these voltages will be suppressed at the differential output voltage Vdiff. In particular, if the voltage signal of the transimpedance amplifier reference voltage Vref_TIA may be represented by a signal component Vsignal and a noise component Vn as follows, $$Vref\_TIA = Vsignal + Vn$$

the voltage divider relationship between the transimpedance amplifier reference voltage Vref_TIA and the diode bias voltage Vdiode may allow the corresponding noise component of the diode bias voltage Vdiode to be represented as $$Vn*(R1+R2+R3)/(R2+R3).$$

Further, the voltage divider relationship between the transimpedance amplifier reference voltage Vref_TIA and the common-mode voltage Vcm may allow the corresponding noise component of the common-mode voltage Vcm to be represented as $$Vn*(R3)/(R2+R3).$$

These expressions for the noise components of the transimpedance amplifier reference voltage Vref_TIA, the diode bias voltage Vdiode, and the common-mode voltage Vcm may be substituted into the expressions above for the differential output voltage Vdiff at low and high frequencies to approximately determine the noise component of the differential output voltage Vdiff at low and high frequencies, respectively. At low frequencies, therefore, the noise component of the differential output voltage Vdiff may be approximately represented as $$2*(Vn - Vn*(R3)/(R2+R3)) = 2*Vn*R2/(R2+R3),$$

and at high frequencies, the noise component of the differential output voltage Vdiff may be approximately represented as $$Gain*(Vn*(R1+R2+R3)/(R2+R3) - Vn) = Gain*Vn*R1/(R2+R3).$$

The amount of noise suppression at the different output voltage Vdiff imparted by the voltage divider 136 may thus be represented by the divider ratios R2/(R2+R3) and R1/(R2+R3) at low and high frequencies, respectively. Supply noise in the bias voltage generator 132 may be similarly suppressed, and thus the power supply rejection ratio (PSRR) of the transimpedance circuit 100 may be improved relative to conventional approaches. Consequently, the transimpedance circuits 100 disclosed herein may exhibit reduced noise and improved SNR at the differential output voltage relative to conventional approaches in which one or more of the bias, reference, and common-mode voltages are uncorrelated (e.g., with some or all provided by different, uncorrelated voltage and/or current sources).

In the transimpedance circuit 100 of FIG. 1, the diode bias voltage Vdiode is provided to the cathode of a photodiode 124. In other embodiments, a transimpedance circuit 100 like that of FIG. 1 may be used to bias the anode of the photodiode 124.

Figure 2:
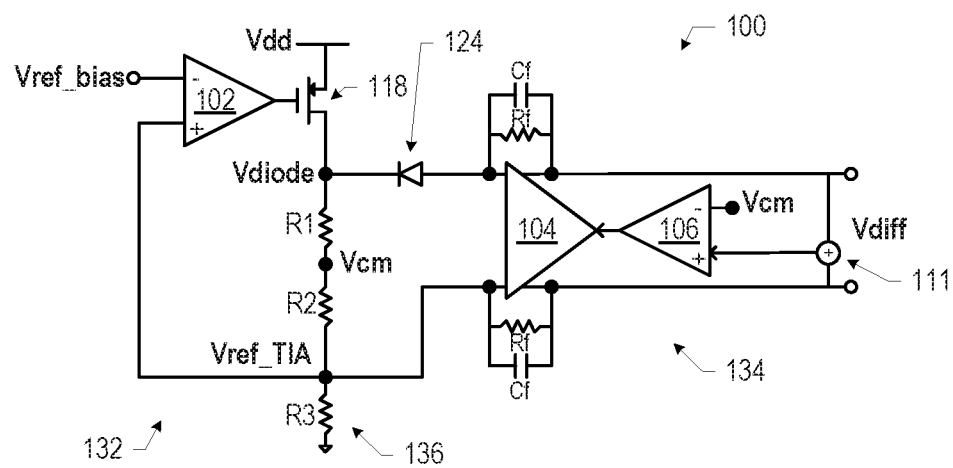

In the transimpedance circuit 100 of FIG. 1, the common-mode voltage Vcm is at a node "below" the transimpedance amplifier reference voltage Vref_TIA in the voltage divider 136. In other embodiments, the common-mode voltage Vcm may be taken at a node "above" the transimpedance amplifier reference voltage VrefTIA in a voltage divider 136. FIG. 2 is a schematic of an example of such a transimpedance circuit 100. The transimpedance circuit 100 of FIG. 2 shares many elements with the transimpedance circuit 100 of FIG. 1; for clarity, a discussion of these elements is not repeated, and these elements may take the form of any of the embodiments disclosed herein.

Figure 3:
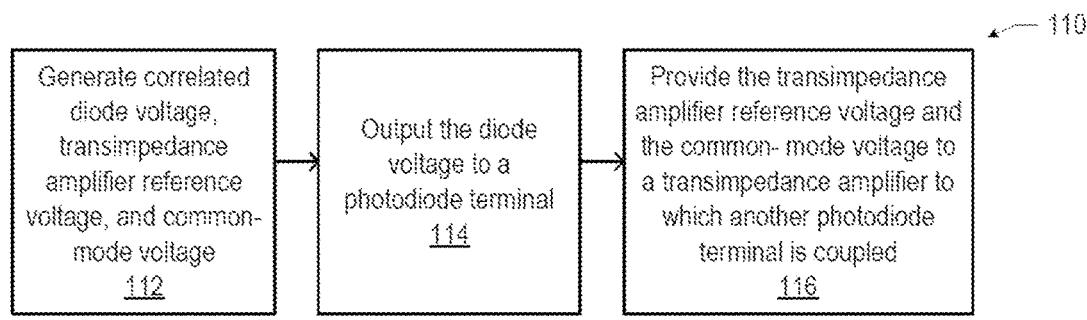
FIG. 3 is a flow diagram of an example method of operating a transimpedance circuit, in accordance with various embodiments.

As noted above, providing correlated voltages to support the operation of a transimpedance circuit may desirably suppress noise in the output. FIG. 3 is a flow diagram of an example method 110 of operating a transimpedance circuit, in accordance with various embodiments. Although the operations of the method 110 may be illustrated with reference to particular embodiments of the transimpedance circuits 100 disclosed herein, the method 110 may be performed using any suitable circuitry. Operations are illustrated once each and in a particular order in FIG. 3, but the operations may be performed in parallel, reordered, and/or repeated as desired.

At 112, correlated voltages including a diode voltage, a transimpedance amplifier reference voltage, and a common-mode voltage, may be generated. For example, a bias voltage generator 132 may include a voltage divider 136 to generate a diode voltage Vdiode, a transimpedance amplifier reference voltage Vref_TIA, and a common-mode voltage Vcm, as discussed above with reference to FIGS. 1 and 2.

At 114, the diode voltage (generated at 112) may be output to a photodiode terminal. The diode voltage may bias the photodiode. For example, the diode voltage Vdiode may be output to a cathode or an anode of a photodiode 124, as discussed above with reference to FIGS. 1 and 2.

At 116, the transimpedance amplifier reference voltage (generated at 112) and the common-mode voltage (generated at 112) may be provided to a transimpedance amplifier to which another photodiode terminal is coupled. For example, the transimpedance amplifier reference voltage Vref_TIA and the common-mode voltage Vcm of the bias voltage generator 132 may be provided to the transimpedance amplifier 134, as discussed above with reference to FIGS. 1 and 2. The transimpedance amplifier 134 may be coupled to the anode or cathode of the photodiode 124, as illustrated in FIGS. 1 and 2, respectively, and may be receive the current of the photodiode 124 as an input.

Figure 4:
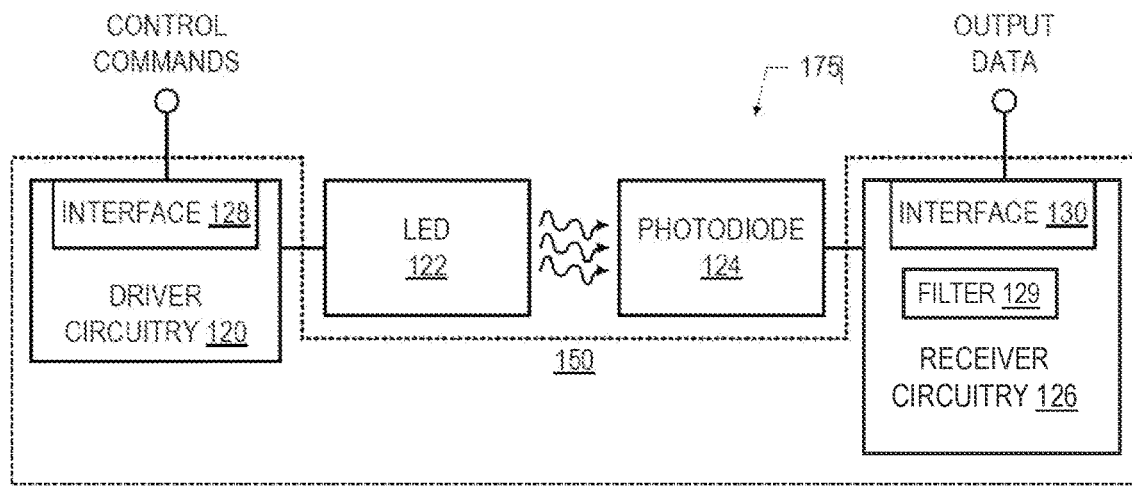
FIG. 4 is a block diagram of an example photometric system that may include any of the transimpedance circuits disclosed herein.
Figure 5:
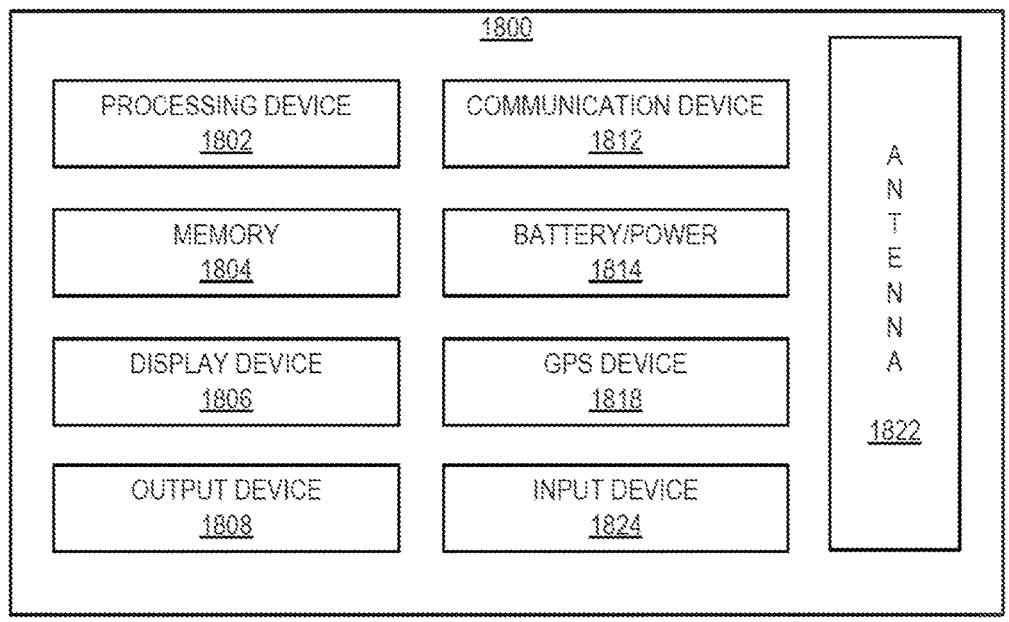
FIG. 5 is a block diagram of an example electrical device that may include any of the transimpedance circuits disclosed herein.

The transimpedance circuits 100 disclosed herein may be included in any suitable component or system of components. FIGS. 4-5 illustrate various examples of apparatuses that may include any of the transimpedance circuits 100 disclosed herein.

FIG. 4 is a block diagram of an example photometric system 175 that may include any of the transimpedance circuits 100 disclosed herein. The photometric system 175 may include a photometric front end 150 having driver circuitry 120 and receiver circuitry 126. In some embodiments, the photometric front end 150 may be a single apparatus that includes both the driver circuitry 120 and the receiver circuitry 126, while in other embodiments, different apparatuses may include the driver circuitry 120 and the receiver circuitry 126, respectively. The driver circuitry 120 may generate a drive signal (e.g., a drive current) for a light-emitting diode (LED) 122. The driver circuitry 120 may include an interface 128 through which control commands may be received to configure the driver circuitry 120 (e.g., to program the magnitude of the drive current).

The drive signal from the driver circuitry 120 may cause the LED 122 to emit light, and this light may be detected by a photodiode 124. The photodiode 124 may be coupled to the receiver circuitry 126, and the receiver circuitry 126 may receive the electrical signals generated by the photodiode 124 in response to the detected light. In some embodiments, the photodiode 124 and the receiver circuitry 126 together may include any of the transimpedance circuits 100 disclosed herein. The receiver circuitry 126 may include other circuitry, such as a filter 129 (e.g., a bandpass filter) and an analog-to-digital converter (not shown). The receiver circuitry 126 may include an interface 130 through which output data may be provided. This output data may include data representative of the received electrical signals from the photodiode 124, and may also include data representative of the driving signal provided to the LED 122 (e.g., when the driver circuitry 120 is in communication with the receiver circuitry 126). Although FIG. 4 depicts a single LED 122 and a single photodiode 124, this is simply for ease of illustration, and a photometric system 175 may include any desired number of LEDs 122 and photodiodes 124. In some embodiments, the receiver circuitry 126 may include a single terminal for coupling to the cathodes (anodes) of multiple photodiodes 124, and different terminals for coupling to the anodes (cathodes) of the multiple photodiodes 124.

In some embodiments, the photometric system 175 may be part of a vital signs monitoring (VSM) system. For example, the photometric system 175 may be part of a photoplethysmograph (PPG) system in which the LED 122 and the photodiode 124 are positioned proximate to a patient's tissue so that the photodiode 124 may detect light, emitted by the LED 122, that has been transmitted through and/or reflected from the tissue; information about the tissue (e.g., the oxygen content of the tissue) may be derived from such data, as known in the art.

FIG. 5 is a block diagram of an example electrical device 1800 that may include any of the transimpedance circuits 100 disclosed herein, or may include one or more components that perform any of the methods 110 disclosed herein. For example, the input device(s) 1824 of the electrical device 1800 may include one or more photodiodes 124 and associated receiver circuitry 126, and the photodiodes 124/receiver circuitry 126 may include any of the transimpedance circuits 100 disclosed herein or the receiver circuitry 126 may perform any of the methods 110 disclosed herein. In some embodiments, the electrical device 1800 may include the photometric front end 150 and/or the photometric system 175 of FIG. 4. A number of components are illustrated in FIG. 5 as included in the electrical device 1800, but any one or more of these components may be omitted or duplicated, as suitable for the application. In some embodiments, some or all of the components included in the electrical device 1800 may be attached to one or more motherboards. In some embodiments, some or all of these components may be fabricated onto a single system-on-a-chip (SoC) die.

Additionally, in various embodiments, the electrical device 1800 may not include one or more of the components illustrated in FIG. 5, but the electrical device 1800 may include interface circuitry for coupling to the one or more components. For example, the electrical device 1800 may not include a display device 1806, but may include display device interface circuitry (e.g., a connector and driver circuitry) to which a display device 1806 may be coupled. In another set of examples, the electrical device 1800 may not include an input device 1824 or an output device 1808, but may include audio input or output device interface circuitry (e.g., connectors and supporting circuitry) to which an input device 1824 or output device 1808 may be coupled.

The electrical device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The electrical device 1800 may include a memory 1804, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include embedded dynamic random access memory (eDRAM) or spin transfer torque magnetic random access memory (STT-MRAM).

In some embodiments, the electrical device 1800 may include a communication device 1812 (e.g., one or more communication devices). For example, the communication device 1812 may be configured for managing wireless communications for the transfer of data to and from the electrical device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication device 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication device 1812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication device 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication device 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication device 1812 may operate in accordance with other wireless protocols in other embodiments. The electrical device 1800 may include an antenna 1822 to facilitate wireless communications and/or to receive other wireless communications (such as AM or FM radio transmissions).

In some embodiments, the communication device 1812 may manage wired communications, such as electrical, optical, or any other suitable communication protocols (e.g., the Ethernet). As noted above, the communication device 1812 may include multiple communication devices. For instance, a first communication device 1812 may be dedicated to shorter-range wireless communications such as Wi-Fi or Bluetooth, and a second communication device 1812 may be dedicated to longer-range wireless communications such as global positioning system (GPS), EDGE, GPRS, CDMA, WiMAX, LTE, EV-DO, or others. In some embodiments, a first communication device 1812 may be dedicated to wireless communications, and a second communication device 1812 may be dedicated to wired communications.

The electrical device 1800 may include battery/power circuitry 1814. The battery/power circuitry 1814 may include one or more energy storage devices (e.g., batteries or capacitors) and/or circuitry for coupling components of the electrical device 1800 to an energy source separate from the electrical device 1800 (e.g., AC line power).

The electrical device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), an LED display, or a flat panel display.

The electrical device 1800 may include one or more output devices 1808 (or corresponding interface circuitry, as discussed above). In some embodiments, the output device 1808 may include one or more LEDs 122 and driver circuitry 120, as discussed above with reference to FIG. 4. In some embodiments, the output device 1808 may include an audio codec, a video codec, a printer, a wired or wireless transmitter for providing information to other devices, or an additional storage device. In some embodiments, the output device 1808 may include any device that generates an audible indicator, such as speakers, headsets, or earbuds.

The electrical device 1800 may include one or more input devices 1824 (or corresponding interface circuitry, as discussed above). In some embodiments, the input device 1824 may include one or more photodiodes 124 and receiver circuitry 126, as discussed above with reference to FIG. 4. Examples of the input devices 1824 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader. In some embodiments, the input device 1824 may include any device that generates a signal representative of a sound, such as microphones, microphone arrays, or digital instruments (e.g., instruments having a musical instrument digital interface (MIDI) output).

The electrical device 1800 may include a GPS device 1818 (or corresponding interface circuitry, as discussed above). The GPS device 1818 may be in communication with a satellite-based system and may receive a location of the electrical device 1800, as known in the art.

The electrical device 1800 may have any desired form factor, such as a handheld or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server device or other networked computing component, a printer, a scanner, a monitor, a set-top box, an entertainment control unit, a vehicle control unit, a digital camera, a digital video recorder, or a wearable electrical device. In some embodiments, the electrical device 1800 may be any other electronic device that processes data.

The following paragraphs provide various examples of the embodiments disclosed herein.

Example 1 is a transimpedance circuit, including: a current source bias terminal; a current source output terminal; a transimpedance amplifier coupled to the current source output terminal; wherein voltage signals at the current source bias terminal are correlated with voltage signals at the current source output terminal.

Example 2 includes the subject matter of Example 1, and further includes: a voltage divider having first and second voltage terminals, wherein the first voltage terminal of the voltage divider is coupled to the current source bias terminal, and the second voltage terminal of the voltage divider is coupled to a reference voltage terminal of the transimpedance amplifier.

Example 3 includes the subject matter of Example 2, and further specifies that the voltage divider has a third voltage terminal, and the third voltage terminal of the voltage divider is coupled to a common-mode voltage terminal of the transimpedance amplifier.

Example 4 includes the subject matter of any of Examples 2-3, and further includes: an amplifier having an output coupled to a transistor gate, wherein a source/drain of the transistor is coupled to the first voltage terminal.

Example 5 includes the subject matter of Example 4, and further specifies that the second voltage terminal is coupled to an input of the amplifier.

Example 6 includes the subject matter of Example 5, and further specifies that the input of the amplifier is a first input of the amplifier, and a reference bias voltage is coupled to a second input of the amplifier.

Example 7 includes the subject matter of any of Examples 1-6, and further specifies that an output of the transimpedance amplifier is a differential voltage.

Example 8 includes the subject matter of any of Examples 1-7, and further includes: a current source coupled between the current source bias terminal and the current source output terminal.

Example 9 includes the subject matter of Example 8, and further specifies that the current source includes a photodiode.

Example 10 is a photometric system, including: photodiode receiver circuitry, wherein the photodiode receiver circuitry includes a first photodiode terminal, a second photodiode terminal, and a transimpedance amplifier to generate a differential voltage from a current between the first photodiode terminal and the second photodiode terminal, and wherein voltages at the first photodiode terminal and the second photodiode terminal are correlated.

Example 11 includes the subject matter of Example 10, and further includes: light-emitting diode (LED) driver circuitry, wherein the LED driver circuitry is to couple to an LED to generate drive signals to illuminate the LED.

Example 12 includes the subject matter of Example 11, and further specifies that the LED driver circuitry and the photodiode receiver circuitry are part of a single apparatus.

Example 13 includes the subject matter of any of Examples 11-12, and further includes: an LED coupled to the LED driver circuitry.

Example 14 includes the subject matter of any of Examples 10-13, and further includes: the photodiode, wherein the photodiode is coupled to the photodiode receiver circuitry.

Example 15 includes the subject matter of any of Examples 10-14, and further specifies that the photodiode receiver circuitry includes a plurality of first photodiode terminals for a corresponding plurality of photodiodes, and the second photodiode terminal is shared across the plurality of photodiodes.

Example 16 includes the subject matter of any of Examples 10-15, and further specifies that the first photodiode terminal is a cathode terminal and the second photodiode terminal is an anode terminal.

Example 17 is a method of operating a photodiode circuit, including: providing a bias voltage to a photodiode terminal; and providing a common-mode voltage to a transimpedance amplifier, wherein the bias voltage and the common-mode voltage are correlated.

Example 18 includes the subject matter of Example 17, and further includes: providing a reference voltage to the transimpedance amplifier, wherein the reference voltage and the bias voltage are correlated.

Example 19 includes the subject matter of any of Examples 17-18, and further specifies that the transimpedance amplifier is to receive a photodiode current and output a differential voltage.

Example 20 includes the subject matter of Example 19, and further includes: providing the differential voltage to a filter.

The invention claimed is:

1. A transimpedance circuit, comprising:
  a current source bias terminal;
  a current source output terminal;
  a transimpedance amplifier coupled to the current source output terminal; and
  a voltage divider having first and second voltage terminals, wherein the first voltage terminal of the voltage divider is coupled to the current source bias terminal, and the second voltage terminal of the voltage divider is coupled to a reference voltage terminal of the transimpedance amplifier,
  wherein voltage signals at the current source bias terminal are correlated with voltage signals at the current source output terminal.

2. The transimpedance circuit of claim 1, wherein the voltage divider has a third voltage terminal, and the third voltage terminal of the voltage divider is coupled to a common-mode voltage terminal of the transimpedance amplifier.

3. The transimpedance circuit of claim 1, further comprising:
  an amplifier having an output coupled to a transistor gate, wherein a source/drain of the transistor is coupled to the first voltage terminal.

4. The transimpedance circuit of claim 3, wherein the second voltage terminal is coupled to an input of the amplifier.

5. The transimpedance circuit of claim 4, wherein the input of the amplifier is a first input of the amplifier, and a reference bias voltage is coupled to a second input of the amplifier.

6. The transimpedance circuit of claim 1, wherein an output of the transimpedance amplifier is a differential voltage.

7. The transimpedance circuit of claim 1, further comprising:
a current source coupled between the current source bias terminal and the current source output terminal.

8. The transimpedance circuit of claim 7, wherein the current source includes a photodiode.

9. A photometric system, comprising:
photodiode receiver circuitry, wherein the photodiode receiver circuitry includes a first photodiode terminal, a second photodiode terminal, and a transimpedance amplifier to generate a voltage from a current between the first photodiode terminal and the second photodiode terminal, and wherein voltages at the first photodiode terminal and the second photodiode terminal are correlated; and
a voltage divider having first and second voltage terminals, wherein the first voltage terminal of the voltage divider is coupled to the first photodiode terminal, and the second voltage terminal of the voltage divider is coupled to a reference voltage terminal of the transimpedance amplifier.

10. The photometric system of claim 9, further comprising:
light-emitting diode (LED) driver circuitry, wherein the LED driver circuitry is to couple to an LED to generate drive signals to illuminate the LED.

11. The photometric system of claim 10, wherein the LED driver circuitry and the photodiode receiver circuitry are part of a single apparatus.

12. The photometric system of claim 10, further comprising:
an LED coupled to the LED driver circuitry.

13. The photometric system of claim 9, further comprising:
a photodiode comprising the first photodiode terminal and the second photodiode terminal, wherein the photodiode is coupled to the photodiode receiver circuitry.

14. The photometric system of claim 9, wherein the photodiode receiver circuitry includes a plurality of first photodiode terminals for a corresponding plurality of photodiodes, and the second photodiode terminal is shared across the plurality of photodiodes.

15. The photometric system of claim 9, wherein the first photodiode terminal is a cathode terminal and the second photodiode terminal is an anode terminal.

16. A method of operating a photodiode circuit, comprising:
providing a bias voltage to a photodiode terminal;
providing a common-mode voltage to a transimpedance amplifier, wherein the bias voltage and the common-mode voltage are correlated; and
providing a voltage divider having first and second voltage terminals, wherein the first voltage terminal of the voltage divider is coupled to the photodiode terminal to provide the bias voltage, and the second voltage terminal of the voltage divider is coupled to a common-mode voltage terminal of the transimpedance amplifier to provide the common-mode voltage.

17. The method of claim 16, further comprising:
providing a reference voltage to the transimpedance amplifier, wherein the reference voltage and the bias voltage are correlated.

18. The method of claim 16, wherein the transimpedance amplifier is to receive a photodiode current and output a differential voltage.

19. The method of claim 18, further comprising:
providing the differential voltage to a filter.

20. The method of claim 17, wherein the voltage divider has a third voltage terminal, and the third voltage terminal of the voltage divider is coupled to a reference voltage terminal of the transimpedance amplifier to provide the reference voltage.

* * * * *